United States Patent
Mathew et al.

(10) Patent No.: US 6,951,783 B2
(45) Date of Patent: Oct. 4, 2005

(54) CONFINED SPACERS FOR DOUBLE GATE TRANSISTOR SEMICONDUCTOR FABRICATION PROCESS

(75) Inventors: Leo Mathew, Austin, TX (US); Rode R. Mora, Austin, TX (US); Bich-Yen Nguyen, Austin, TX (US); Tab A. Stephens, Austin, TX (US); Anne M. Vandooren, Meylan (FR)

(73) Assignee: Freescale Semiconductor, Inc., Austin, TX (US)

( * ) Notice: Subject to any disclaimer, the term of this patent is extended or adjusted under 35 U.S.C. 154(b) by 73 days.

(21) Appl. No.: 10/695,163

(22) Filed: Oct. 28, 2003

(65) Prior Publication Data

US 2005/0101069 A1 May 12, 2005

(51) Int. Cl.[7] .............................................. H01L 21/84
(52) U.S. Cl. ...................................... 438/157; 438/595
(58) Field of Search ................................. 438/157, 595

(56) References Cited

U.S. PATENT DOCUMENTS

| | | | | |
|---|---|---|---|---|
| 6,413,802 B1 | * | 7/2002 | Hu et al. ..................... | 438/151 |
| 6,432,829 B2 | * | 8/2002 | Muller et al. ................ | 438/694 |
| 6,475,869 B1 | * | 11/2002 | Yu .............................. | 438/303 |
| 6,492,212 B1 | * | 12/2002 | Ieong et al. ................. | 438/157 |
| 6,635,909 B2 | * | 10/2003 | Clark et al. .................. | 257/192 |
| 6,657,252 B2 | * | 12/2003 | Fried et al. .................. | 257/316 |
| 2003/0151077 A1 | * | 8/2003 | Mathew et al. ............. | 257/250 |

* cited by examiner

Primary Examiner—Trung Dang
(74) Attorney, Agent, or Firm—Joseph P. Lally

(57) ABSTRACT

A semiconductor fabrication process includes forming a silicon fin overlying a substrate. A gate dielectric is formed on primary faces of the fin. A gate electrode is formed over at least two faces of the fin. Dielectric spacers are then selectively formed in close proximity and confined to the sidewalls of the gate electrode thereby leaving a majority of the primary fin faces exposed. Thereafter a silicide is formed on the primary fin faces. The forming of the gate electrode in one embodiment includes depositing polysilicon over the fin and substrate, depositing a capping layer over the polysilicon, patterning photoresist over the capping layer and etching through the capping layer and the polysilicon with the patterned photoresist in place wherein the etching produces a polysilicon width that is less than a width of the capping layer to create voids under the capping layer adjacent sidewalls of the polysilicon where the confined spacers can be formed.

19 Claims, 4 Drawing Sheets

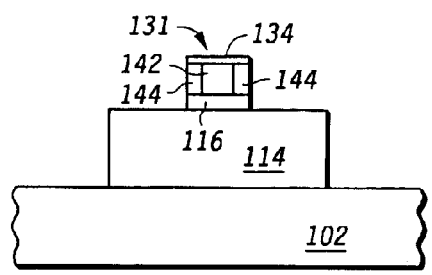
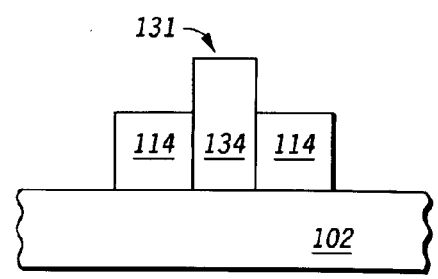
FIG. 8  FIG. 9
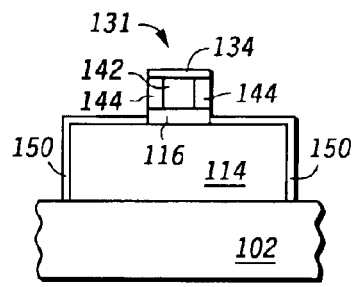
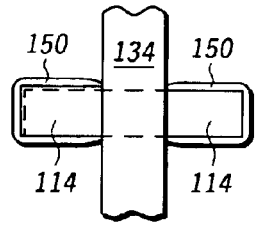
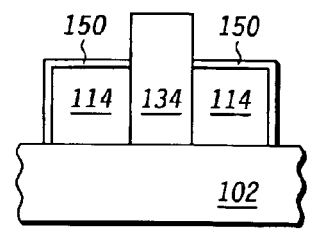
FIG. 10  FIG. 11  FIG. 12

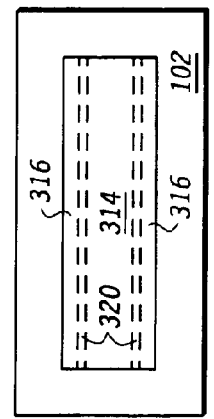
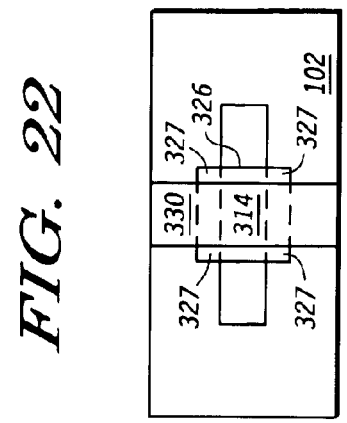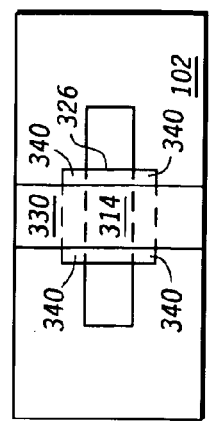
FIG. 20  FIG. 21  FIG. 22
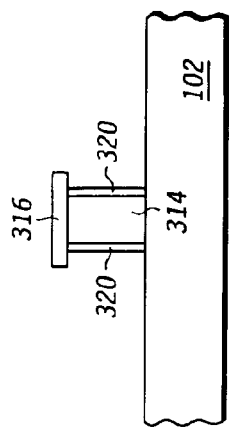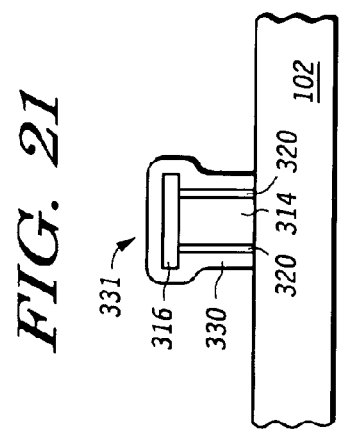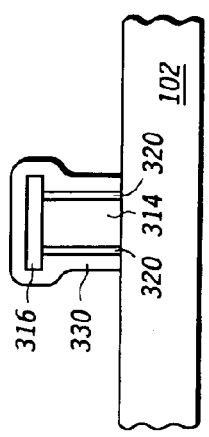
FIG. 23  FIG. 24  FIG. 25
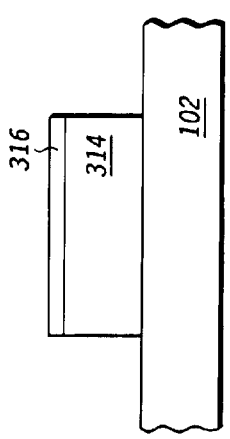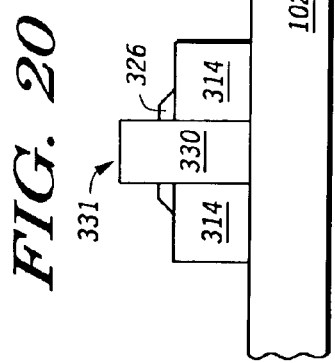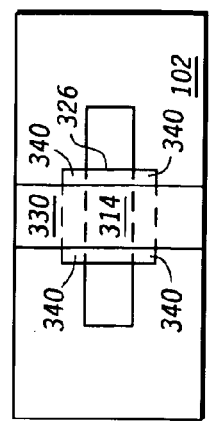
FIG. 26  FIG. 27  FIG. 28

CONFINED SPACERS FOR DOUBLE GATE TRANSISTOR SEMICONDUCTOR FABRICATION PROCESS

BACKGROUND OF THE INVENTION

1. Field of the Invention

The present invention relates generally to the field of semiconductor fabrication and, more particularly, to semiconductor fabrication processes employing double gate or "fin" FET transistors.

2. Description of Related Art

A conventional metal-oxide-semiconductor (MOS) transistor has a structure in which a gate electrode is displaced above the transistor channel region by an intermediate gate dielectric film. The region below the channel may include the bulk substrate or an epitaxial film. The transistor is operated by applying a bias to the gate electrode. The bulk material is likely grounded or biased to a constant voltage. Thus, the conventional transistor may be described as having a single-sided gate since the gate exists on only one side of (i.e., above) the channel.

It is generally recognized that single-sided gate transistors inherently exhibit operational characteristics, including leakage current, drive current, and sub-threshold slope, that are less than ideal. These parameters are particularly critical in low power applications such as wireless technology. Multiple-gate transistor structures, in which gate dielectrics and gate electrodes are formed on two (or more) sides of the transistor channel, have been proposed to address this problem.

One example of a multiple gate transistor is the "fin" FET, so named because the transistor channel is a fin or wall of silicon positioned above the underlying substrate. A gate dielectric is formed on the faces of the fin and a gate electrode is formed by depositing and patterning polysilicon or another suitable material. The exposed portions of the fin (i.e., the portions not covered by the gate electrode) serve as the source/drain regions in the finished transistor structure.

Reducing resistivity in the source/drain regions is important in the design of high performance transistors including multiple gate transistors. This goal is typically achieved, at least in part, by using a silicide process in which a material that is reactive with silicon, such as titanium, is deposited over a transistor and heated in an oven. During this heat step, a silicide is formed wherever the deposited material contacts exposed silicon. The exposed silicon includes the exposed source/drain regions and an upper surface of the silicon-based gate electrode. Additional reduction of resistivity in the source/drain regions may be achieved, at least in part, by growing silicon or silicon germanium selectively on the exposed silicon faces. To prevent an electrical short between the gate and the source/drain regions from forming during the silicide process, a dielectric spacer is formed adjacent the gate sidewalls prior to silicide deposition. The silicide material does not react with the underlying dielectric. The unreacted silicide material is then removed following the silicide heat treatment.

In a fin-based process, conventional processing as described above has an undesirable consequence. Specifically, the dielectric spacer formed following gate etch forms, not only on the gate electrode sidewalls, but also the vertically oriented primary fin faces in the source/drain regions (i.e., the regions of the fin not covered by the gate electrode). Thus, after spacer formation, the only part of the source/drain regions that is exposed and capable of being silicided is along the very small, top surface of the fins. It would be desirable to implement a process employing a selective epitaxial process or silicide process or both in which the primary fin faces are exposed for silicide and/or selective epitaxial processing while still preventing gate-to-source/drain short circuits.

SUMMARY OF THE INVENTION

The problem identified above is addressed by a semiconductor fabrication process including forming a silicon fin overlying a substrate. A gate dielectric is formed on primary faces of the fin. A gate electrode is formed over at least two faces of the fin. In various embodiments, the gate material may include a combination of one or more materials including polysilicon, polysilicon germanium, titanium nitride, and tantalum silicon nitride. Dielectric spacers are then selectively formed in close proximity and confined to the sidewalls of the gate electrode thereby leaving a majority of the primary fin faces exposed. Thereafter a silicide is formed on the primary fin faces. The forming of the gate electrode in one embodiment includes depositing a conductive gate material over the fin and substrate, depositing a capping layer over the conductive gate material, patterning photoresist over the capping layer and etching through the capping layer and the conductive gate material with the patterned photoresist in place wherein the etching produces a conductive gate material width that is less than a width of the capping layer to create voids under the capping layer adjacent sidewalls of the conductive gate material where the confined spacers can be formed.

BRIEF DESCRIPTION OF THE DRAWINGS

The invention, together with further advantages thereof, may best be understood by reference to the following description taken in conjunction with the accompanying drawings in which:

FIGS. 1–12 illustrate a first embodiment of a method of forming spacers confined to the sidewalls of the gate electrode with a series of partial cross sectional views representing selected steps in a sequence of processing steps;

FIGS. 20–28 illustrate a third embodiment of a method of forming spacers confined to the sidewalls of the gate electrode with a series of partial cross sectional views representing selected steps in a sequence of processing steps.

DETAILED DESCRIPTION OF THE PREFERRED EMBODIMENTS

Figure 1:
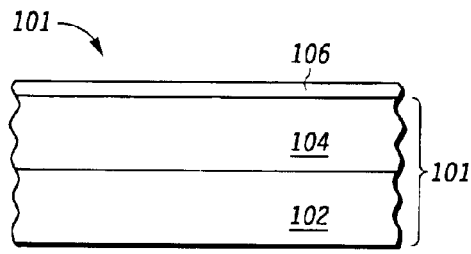

Reference will now be made in detail to the presently preferred embodiments of the invention, examples of which are illustrated in the accompanying drawings. It should be noted that the drawings are in simplified form and are not to precise scale. Although the invention herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention.

Generally speaking, the present invention is concerned with the formation of multiple gate transistors using a silicon fin. The portions of the primary fin faces not covered by the gate electrode are exposed down to silicon prior to performing a subsequent epitaxial or silicide process. Exposing the silicon in the fins improves the efficiency of the subsequent processing and results in source/drain regions with improved resistivity and/or contact resistance.

Turning now to the drawings, FIGS. 1 through 12 illustrate a semiconductor fabrication processing sequence according to one embodiment of the present invention. In the depicted embodiment, a fin is first formed on an underlying substrate. The fin will function as the channel region and the source/drain regions of the resulting transistor. In the depicted process flow, the fin is formed by depositing a dielectric layer 106, such as a silicon nitride layer, over a substrate 101 that includes a silicon substrate portion 104 and a dielectric portion 102. In other embodiments, the top dielectric layer 106 is optional. In one embodiment, a silicon-on-insulator (SOI) wafer provides a shallow, monocrystalline silicon portion 104 and a silicon-oxide portion 102 over an underlying silicon bulk portion (not depicted). In another embodiment, the depicted substrate 101 may be formed by depositing an oxide (or other dielectric) layer 102 and a silicon layer 104 over an existing silicon substrate.

Figure 2:
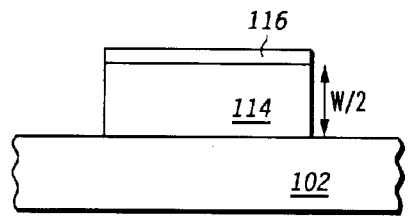
Figure 3:
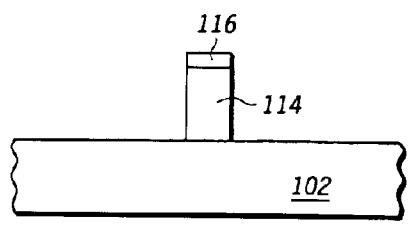

As shown in the cross sections of FIG. 2 and FIG. 3, the silicon fin 114 is then formed by patterning a photoresist layer overlying dielectric layer 106 of FIG. 1, exposing and developing the photoresist layer, and etching through the exposed portions of layers 104 and 106 to leave the fin 114 and a capping dielectric portion 116. As shown in FIG. 2, the vertical displacement of fin 114 above the underlying substrate is roughly equal to W/2 where W represents the electrical width of the resulting transistor in the well known ratio W/L that is a primary determinant of the transistor's source/drain current. The factor of ½ accounts for the double sided characteristic of the transistor. Because the multiple gate transistor has (at least) two active faces, each face of the fin contributes to the width of the transistor.

Figure 4:
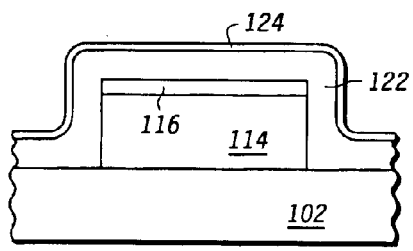
Figure 5:
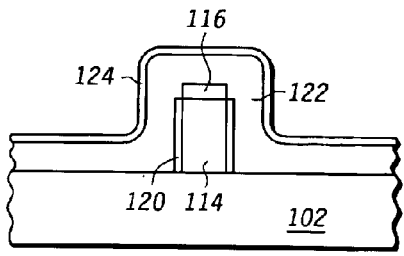

Referring to the cross-sectional views of FIGS. 4 and 5, a gate dielectric layer 120 is formed on the primary faces of fin 114, a first layer 122 is deposited over fin 114 and substrate layer 102, and a capping layer 124 is deposited overlying the first layer. First layer 122 will ultimately serve as the gate electrode for the multiple gate transistor. In the preferred embodiment, the first layer 122 is a polysilicon layer while the capping layer 124 is a material with respect to which first layer 124 can be selectively etched. In an embodiment where first layer 122 is polysilicon, for example, capping layer 124 may be a dielectric such as an oxide (e.g., $SiO_2$) or a nitride (e.g., silicon nitride). In another embodiment desirable for reducing the resistivity of the gate electrode, capping layer 124 is a conductive material such as titanium nitride or the like. In still another embodiment employing two conductive materials, first layer 122 is a conductive material such as silicon germanium while capping layer 124 is polysilicon.

The formation of gate dielectric layer 120 is accomplished in one embodiment by thermal oxidation of the underlying fin 114. In other embodiments, gate dielectric layer 120 includes a deposited non-conductive, high-K, metal oxide (e.g., hafnium oxide) or metal silicate (e.g., hafnium silicate).

Figure 6:
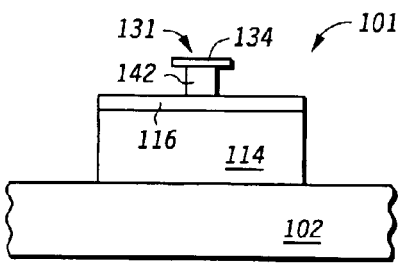
Figure 7:
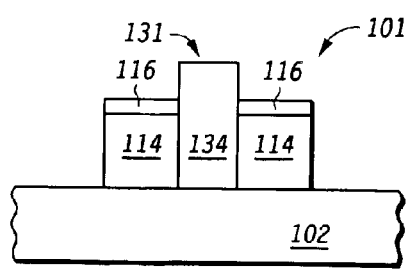
Figure 13:
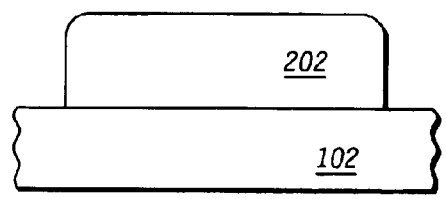
FIGS. 13–19 illustrate a second embodiment of a method of forming spacers confined to the sidewalls of the gate electrode with a series of partial cross sectional views representing selected steps in a sequence of processing steps.
Figure 14:
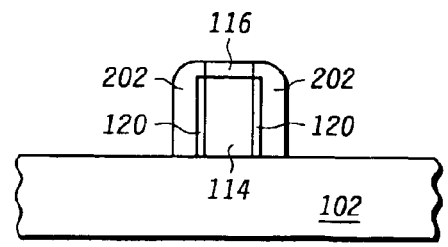

Referring now to the views of FIG. 6 (sectional) and FIG. 7 (plan), a gate electrode 131 is formed by first forming a patterned photoresist layer (not depicted) overlying capping layer 124 of FIGS. 4 and 5 using conventional photolithograhy techniques. Following the photolithography step, capping layer 124 and first layer 122 are etched to produce gate structure 131 as shown. The etching sequence according to one embodiment of the invention includes a first etch portion during which capping layer 124 is patterned to form a capping layer portion 134 and a second etch portion during which the underlying first layer 122 is etched further.

The etching of first layer 122 is preferably carried out using a species that is selective to capping layer portion 134 under conditions that produce a relatively isotropic etch of first layer 122 such that first layer 122 is undercut relative to capping layer portion 134. The first layer portion 142 resulting from this etch process has a lateral dimension that is less than the lateral dimension of the capping layer portion 134 over it (FIG. 6). The voids produced directly under the overhanging portions of capping layer 134 enable the formation of confined spacers that will prevent shorting from the transistor gate to its source/drain regions during silicide formation.

In an embodiment where first layer 122 is polysilicon and capping layer 124 is a refractory metal such as titanium nitride, the etch sequence may include a first portion in which a chlorine-based etchant under strong vacuum and bias produces a highly anisotropic etch of the capping layer followed by a second portion in which a fluorine based etchant under lesser bias produces a selective and undercutting etch of first layer 122.

Turning now to the views of FIG. 8 (sectional) and 9 (plan) respectively, a dielectric spacer 144 is formed in the voids under the overhanging portions of capping layer portion 134. In one embodiment, a silicon nitride deposition is followed by an anisotropic etch. The deposition fills the voids on the sidewalls of the first layer portion 142 while the etch process removes the nitride everywhere except where the nitride is protected from above by capping layer 134. In this manner, dielectric spacers 144 are confined to the sidewalls of first layer portion 142. As seen in the FIG. 9, the portions of silicon fin 114 not covered by gate structure 131 are exposed following the formation of spacers 144.

Exposing a large portion of silicon fin 114 allows for silicon to be selectively grown on the exposed faces and improves the benefit achieved by a subsequent silicide and epitaxial process. Referring to FIGS. 10 and 12, a selective epitaxial growth is performed to form additional conductive regions or source/drain epitaxial structures 150 shown in the cross section view of FIG. 11 (from above). The thick source/drain epitaxial structures 150 reduce the source/drain resistivity and facilitate the subsequent formation of contacts or vias to the source drain regions. A silicide sequence is performed to silicide exposed portion of fins 114. In this sequence, an appropriate metal such as tantalum of titanium is non-selectively deposited over the wafer and subjected to a heat step. Wherever the metal contacts silicon, a silicide is formed during the heat step. The presence of confined spacers 144 prevents the silicide from forming on sidewalls of first layer portion 142 and thereby prevents the formation of an electrical path (short) between the gate electrode and the source/drain regions. By confining the gate structure sidewall spacers to the region in close proximity to the gate structure, the epitaxial structures 150 cover substantially all of the previously exposed portions of silicon fin 114.

Turning now to FIGS. 13 through 19, a second embodiment of a process suitable for producing spacer structures confined closely to the sidewalls of the transistor gate structure in a multiple gate semiconductor process is depicted. In this implementation, a fin is formed in the same way as described previously with respect to FIGS. 1 through 3. Following fin formation as shown in FIG. 3, a gate dielectric 120 is formed as shown on the primary faces of silicon fin 114 in FIG. 14.

Figure 15:
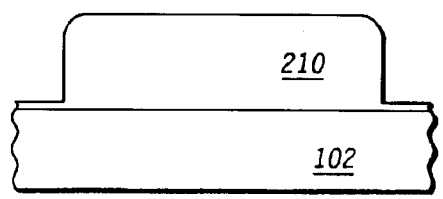
Figure 16:
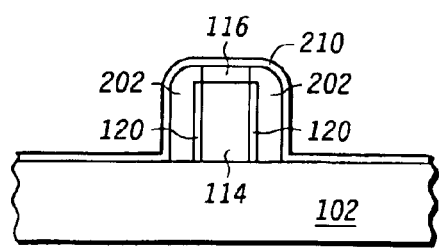

After forming silicon fin 114 and gate dielectric 120, a polysilicon deposition is performed followed by an anisotropic etch (also referred to as a spacer etch) to produce polysilicon spacers 202 everywhere on the primary faces of silicon fin 114 (with the gate dielectric 120 positioned intermediate between them. As shown in FIGS. 15 and 16, a capping material 210 is deposited over polysilicon spacer material 202. Like the capping material described previously, capping material 210 is a material, preferably a metal, capable of being etched selectively with respect to the silicon in silicon spacers 202. In one embodiment, capping layer 210 is a refractory metal such as titanium nitride or tantalum silicon nitride. In another embodiment, the capping material 210 is polysilicon and the spacer 202 is formed using silicon germanium.

Figure 17:
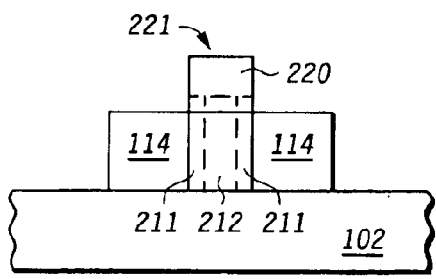
Figure 18:
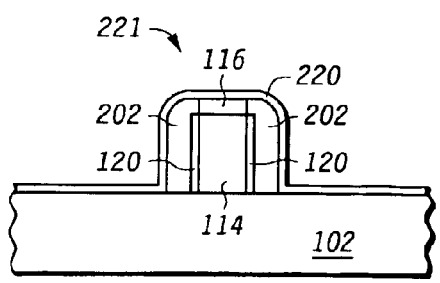
Figure 19:
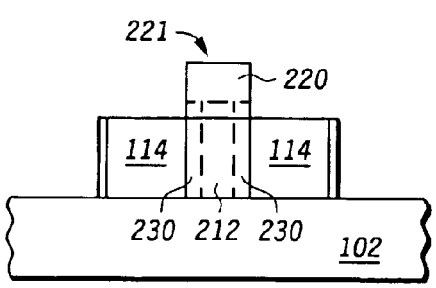

After forming the silicon spacers 202 and capping layer 210, conventional lithography is used to form a gate mask photoresist pattern. Thereafter, a gate etch and trim process is performed to produce a gate structure 221 as shown in FIGS. 17 and 18. Gate structure 221 includes the remaining portions 220 of capping layer 210 and the remaining portions 212 of polysilicon spacers 202. The remaining spacer portions 212 are undercut with respect to capping layer portion 220 as shown in FIG. 17. This undercutting result in voids 211 being formed adjacent the sidewalls of remaining spacer portions 212 under the overhanging capping layer. As shown in FIG. 19, dielectric spacers 230 are confined where the voids 211 were present by depositing a dielectric such as silicon nitride and performing an anisotropic etch. Like the dielectric spacers 144 of FIG. 10, dielectric spacers 230 are confined to the sidewalls of remaining (polysilicon) spacer portions 212, which serve as the gate electrode. The remaining portions of silicon fins 114 are exposed for subsequent silicide and selective epitaxial processing as described above with respect to FIGS. 10 through 12.

A third embodiment of a confined spacer processing sequence according to the present invention is depicted in FIGS. 20 through 28. In this embodiment, the fin formation sequence produces a silicon fin 314 that is thinner than the capping dielectric material (e.g., silicon nitride) 316 above. The silicon fin 314 is trimmed using a relatively isotropic dry etch to produce the under cut effect that leaves capping dielectric material 316 overhanging fin 314 and creating spaces or voids underneath and adjacent the primary faces of fins 314. A gate dielectric 320 is then formed (e.g., by thermal oxidation) on the primary faces of silicon film 314. FIG. 22 shows the structure from above.

Turning now to FIGS. 23 through 25, a polysilicon (or other suitable gate electrode material) deposition is followed by a mask and etch sequence to produce the gate electrode structure 331, which includes a conductive gate electrode 330 and the remaining portions 326 of dielectric 316. The polysilicon etch of gate electrode 330 followed by the etch of layer 316 results in the remaining portions 326 of dielectric 316 having a "shouldered" appearance as shown in FIG. 23. This can be achieved by a dry etch of the layer 316 that leaves a tapered profile or by trimming the polysilicon after the layer 316 has been etched. As seen from the top view of FIG. 25, the remaining dielectric 326 includes a corner portion 327 at each the four corners defined by the gate electrode 330 and silicon fin 314. The four corner portions 327 cover underlying voids that are used to form confined spacers.

As shown in FIGS. 26 through 28, dielectric spacers 340 are formed under the overlying corner portions 327 of dielectric 326. The spacers 340 are formed by depositing a dielectric such as silicon dioxide or silicon nitride and anisotropically etching the deposited dielectric layers. The spacers 340 are thus confined to the area under corner sections 327 of dielectric 326, adjacent the sidewalls of gate electrode 331. The remaining portions of silicon fin 314 may then be subjected to selective epitaxy and silicided.

In each of the described embodiments, spacers are confined to the immediate vicinity of the gate electrode by forming structures that define voids adjacent the gate electrode sidewalls where the voids are covered from above. The spacers are then confined by depositing a dielectric and etching it anisotropically everywhere except where covered from above by the void-defining layer, whether it be a metal or a dielectric such as silicon nitride. Once the confined spacers are formed, the remaining and exposed portions of the silicon fins is suitable for silicide and selective epitaxial. The increase in the exposed areas of the silicon fins following spacer formation is beneficial in achieving low resistance, high performance transistors.

Thus it will apparent to those skilled in the art having the benefit of this disclosure that there has been provided, in accordance with the invention, a process for fabricating a an integrated circuit that achieves the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

What is claimed is:

1. A semiconductor fabrication process, comprising:
   forming a silicon fin overlying a substrate, the fin having first and second primary faces substantially perpendicular to a surface of the substrate;
   forming a gate dielectric on the first and second primary faces of the silicon fin;
   forming a gate electrode overlying the gate dielectric, wherein the gate electrode includes a first material underlying a second material and wherein a width of the first material is less than a width of the second material; and
   forming dielectric spacers confined to regions adjacent to sidewalls of the gate electrode, wherein portions of the primary fin faces outside regions of the dielectric spacers are exposed.

2. The method of claim 1, further comprising forming additional conductive regions overlying the exposed portions of the primary fin faces by epitaxial growth.

3. The method of claim 2, further comprising forming a silicide on the additional conductive regions overlying the exposed portions of the primary fin faces.

4. The method of claim 1, wherein the formation of the gate electrode defines confinement regions adjacent sidewalls of a portion of the gate electrode.

5. The method of claim 4, wherein forming the gate electrode comprises;
   depositing the first material over the fin and substrate;
   depositing a capping layer comprised of the second material over the first material wherein at least one etchant is selective between the capping layer and the first material;
   patterning a photoresist overlying the capping layer;
   etching through the capping layer and the first material as a function of the patterned photoresist, wherein the etching produces a first material width that is less than a width of the capping layer to further define the confinement regions under the capping layer adjacent sidewalls of the first material.

6. The method of claim 5, wherein the capping layer is a material selected from the group of materials consisting of metal, polysilicon, oxide, and nitride.

7. The method of claim 6, wherein the first material is selected from the group of materials consisting of polysilicon and silicon germanium.

8. The method of claim 5, further comprising non-selectively depositing a dielectric spacer material and subsequently etching the spacer material to remove the dielectric spacer material everywhere except where the spacer material has filled the confinement regions adjacent the polysilicon sidewalls.

9. The method of claim 5, further comprising performing a spacer etch of the first material prior to depositing the capping layer.

10. A semiconductor fabrication process, comprising:
    forming a silicon fin overlying a substrate, the fin having first and second primary faces substantially perpendicular to a surface of the substrate;
    forming a gate dielectric on the first and second primary faces of the silicon fin;
    forming a gate electrode overlying the gate dielectric; and
    forming dielectric spacers confined to regions adjacent to sidewalls of the gate electrode, wherein portions of the primary fin faces outside regions of the dielectric spacers are exposed;
    wherein forming the silicon fin comprises:
      depositing a capping dielectric material overlying silicon;
      patterning photoresist overlying the capping dielectric to expose portions of the dielectric material; and
      etching the exposed portions of the capping dielectric and the underlying silicon to form the fin, wherein the etching undercuts the silicon relative to the capping dielectric wherein the silicon fin has a thinner profile than the capping dielectric.

11. A semiconductor fabrication process, comprising:
    forming a silicon fin overlying a substrate, wherein the silicon fin includes first and second primary faces substantially perpendicular to an upper surface of the underlying substrate;
    forming a gate dielectric layer on primary faces of the silicon fin;
    forming a gate electrode in contact with the gate dielectric layer, wherein the gate electrode leaves portions of the primary faces of the silicon fin exposed;
    forming dielectric spacers selectively adjacent sidewalls of the gate electrode wherein portions of the primary fin faces of the dielectric spacers remain exposed after dielectric spacer formation; and
    processing the exposed portions of the primary fin faces to reduce their resistivity;
    wherein forming the gate electrode comprises;
      depositing a first material over the fin and substrate;
      depositing a capping layer over the first material wherein at least one etchant is selective between the capping layer and the first material;
      patterning a photoresist overlying the capping layer;
      etching through the capping layer and the first material as a function of the patterned photoresist, wherein the etching produces a first material width that is less than a width of the capping layer to further define the confinement regions under the capping layer adjacent sidewalls of the first material.

12. The method of claim 11, wherein processing the exposed portions of the primary fin faces includes epitaxially growing silicon on the exposed portions of the primary fin faces.

13. The method of claim 11, wherein processing the exposed portions of the primary fin faces includes forming a silicide on the exposed portions of the primary fin faces.

14. The method of claim 11, wherein the capping layer is a material selected from the group of materials consisting of metal, polysilicon, oxide, and nitride.

15. The method of claim 14, wherein the first material is selected from the group of material comprising polysilicon and silicon germanium.

16. A transistor within an integrated circuit, comprising:
    a silicon fin overlaying a substrate, wherein the silicon fin includes first and second primary faces substantially perpendicular to a surface of the underlying substrate;

a gate dielectric on at least portions of the first and second primary faces of the silicon fin;

a gate electrode overlying the gate dielectric, wherein the gate electrode defines channel regions of the transistor within fin underlying the gate electrode and source/drain regions within remaining portions of the silicon fin; and dielectric spacers adjacent sidewalls of the gate electrode and confined to the proximity of the gate electrode;

wherein the gate electrode comprises a first material and a capping layer overlying the first material, wherein a width of the first material is less than a width of the capping layer, wherein the dielectric spacers occupy regions under the portion of the capping layer overhanging the first material.

17. The transistor of claim 16, wherein the first material is silicon and the capping layer is material selected from a group of materials consisting of metal, oxide, and nitride.

18. The transistor of claim 16, further comprising, additional conductive material formed on portions of the silicon fin not covered by the gate electrode, wherein the confined spacers prevent electrical conduction between the additional conductive material and the gate electrode.

19. A semiconductor fabrication process, comprising:

forming a silicon fin overlying a substrate, the fin having first and second primary faces substantially perpendicular to a surface of the substrate;

forming a gate dielectric on the first and second primary faces of the silicon fin;

forming a gate electrode overlying the gate dielectric;

forming a capping layer overlying the gate electrode and patterning the capping layer, wherein the capping layer forms a cap overlying the gate electrode and having a lateral dimension greater than a lateral dimension of the underlying gate electrode, further forming a confined region adjacent side-walls of the gate electrode; and forming dielectric spacers confined within the confinement regions adjacent sidewalls of the gate electrode, wherein portions of the primary fin faces outside regions of the dielectric spacers are exposed.

* * * * *

UNITED STATES PATENT AND TRADEMARK OFFICE
CERTIFICATE OF CORRECTION

PATENT NO. : 6,951,783 B2  Page 1 of 1
APPLICATION NO. : 10/695163
DATED : October 28, 2003
INVENTOR(S) : Leo Mathew It is certified that error appears in the above-identified patent and that said Letters Patent is hereby corrected as shown below:

In Column 8, Line 64, Claim No. 16:
 Change "overlaying" to --overlying--

In Column 9, Line 5, Claim No. 16:
 Change "within fin underlying" to --within the silicon fin underlying--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,951,783 B2  
APPLICATION NO. : 10/695163  
DATED : October 4, 2005  
INVENTOR(S) : Leo Mathew Page 1 of 1

It is certified that error appears in the above-identified patent and that said Letters Patent is hereby corrected as shown below:

In Column 8, Line 64, Claim No. 16:
   Change "overlaying" to --overlying--

In Column 9, Line 5, Claim No. 16:
   Change "within fin underlying" to --within the silicon fin underlying--

This certificate supersedes the Certificate of Correction issued May 13, 2008.

Signed and Sealed this

Third Day of June, 2008

JON W. DUDAS  
*Director of the United States Patent and Trademark Office*